US011915733B2

(12) United States Patent
Khwa et al.

(10) Patent No.: US 11,915,733 B2
(45) Date of Patent: Feb. 27, 2024

(54) MEMORY DEVICES, CIRCUITS AND METHODS OF ADJUSTING A SENSING CURRENT FOR THE MEMORY DEVICE

(71) Applicant: Taiwan Semiconductor Manufacturing Company, Ltd., Hsinchu (TW)

(72) Inventors: Win-San Khwa, Taipei (TW); Jui-Jen Wu, Hsinchu (TW); Jen-Chieh Liu, Hsinchu (TW); Meng-Fan Chang, Taichung (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 217 days.

(21) Appl. No.: 17/577,040

(22) Filed: Jan. 17, 2022

(65) Prior Publication Data
US 2023/0028413 A1 Jan. 26, 2023

Related U.S. Application Data

(60) Provisional application No. 63/225,405, filed on Jul. 23, 2021.

(51) Int. Cl.
*G11C 11/16* (2006.01)
(52) U.S. Cl.
CPC ........ *G11C 11/1673* (2013.01); *G11C 11/161* (2013.01)
(58) Field of Classification Search
CPC .............. G11C 11/161; G11C 11/1655; G11C 11/1673; G11C 11/56; G11C 11/5607; G11C 13/0026; G11C 13/004; G11C 2013/0054; G11C 7/06; G11C 7/062
USPC ........................................................ 365/158
See application file for complete search history.

(56) References Cited

U.S. PATENT DOCUMENTS

| 6,054,879 A * | 4/2000 | Meng ..................... G11C 7/067 327/54 |
| 6,122,212 A * | 9/2000 | Bui ......................... G11C 7/062 365/207 |
| 6,259,622 B1 * | 7/2001 | Fried ................... G11C 11/5692 365/104 |
| 6,400,607 B1 * | 6/2002 | Pasotti ................ G11C 11/5642 365/185.21 |
| 9,065,480 B1 * | 6/2015 | Tseng ..................... H03M 3/388 |

(Continued)

OTHER PUBLICATIONS

Yi-Chun Shih et al., "A Reflow-capable, Embedded 8Mb STT-MRAM Macro with 9nS Read Access Time in 16nm FinFET Logic CMOS Process", IEEE International Electron Devices Meeting (IEDM), 2020.

*Primary Examiner* — Ly D Pham
(74) *Attorney, Agent, or Firm* — Finnegan, Henderson, Farabow, Garrett & Dunner, L.L.P

(57) ABSTRACT

A circuit includes a sense amplifier, a first clamping circuit, a second clamping circuit, and a feedback circuit. The first clamping circuit includes first clamping branches coupled in parallel between the sense amplifier and a memory array. The second clamping circuit includes second clamping branches coupled in parallel between the sense amplifier and a reference array. The feedback circuit is configured to selectively enable or disable one or more of the first clamping branches or one or more of the second clamping branches in response to an output data outputted by the sense amplifier.

20 Claims, 4 Drawing Sheets

(56) References Cited

U.S. PATENT DOCUMENTS

| | | | |
|---|---|---|---|
| 2002/0089024 A1* | 7/2002 | Iwata | B82Y 10/00 257/421 |
| 2006/0120174 A1* | 6/2006 | Chou | G11C 16/24 365/189.06 |
| 2012/0050085 A1* | 3/2012 | Kon | H03M 1/687 341/154 |
| 2015/0187394 A1* | 7/2015 | Lee | G11C 7/065 365/207 |
| 2020/0127675 A1* | 4/2020 | Guo | H03M 1/1057 |
| 2020/0301667 A1* | 9/2020 | Hung | G11C 16/0416 |

* cited by examiner

MEMORY DEVICES, CIRCUITS AND METHODS OF ADJUSTING A SENSING CURRENT FOR THE MEMORY DEVICE

REFERENCE TO RELATED APPLICATION

This application claims priority of U.S. Provisional Application No. 63/225,405, filed on Jul. 23, 2021, entitled "METHOD FOR ADJUSTING SENSING CURRENT," the entirety of which is incorporated by reference herein.

BACKGROUND

Recent development in semiconductor memory devices involves spin electronics, which combines semiconductor technology and magnetic materials and devices. The spin polarization of electrons can be used to indicate the state of "1" or "0." One such spin electronic device is a spin torque transfer (STT) magnetic tunneling junction (MTJ) device. Magneto-resistive random access memory (MRAM) is a non-volatile random access memory technology using MTJ devices to store data. In an MRAM cell, a changeably-magnetized magnetic layer can be magnetized in two orientations relative to a permanently magnetized layer, providing distinctly different serial resistances. A parallel alignment state of the magnetic layers has a relatively low resistance, while an anti-parallel alignment state of the magnetic layers has a relatively high resistance.

BRIEF DESCRIPTION OF THE DRAWINGS

Aspects of the present disclosure are best understood from the following detailed description when read with the accompanying figures. It is noted that, in accordance with standard practice in the industry, various features are not drawn to scale. In fact, the dimensions of the various features may be arbitrarily increased or reduced for clarity of discussion.

DETAILED DESCRIPTION

Figure 1:
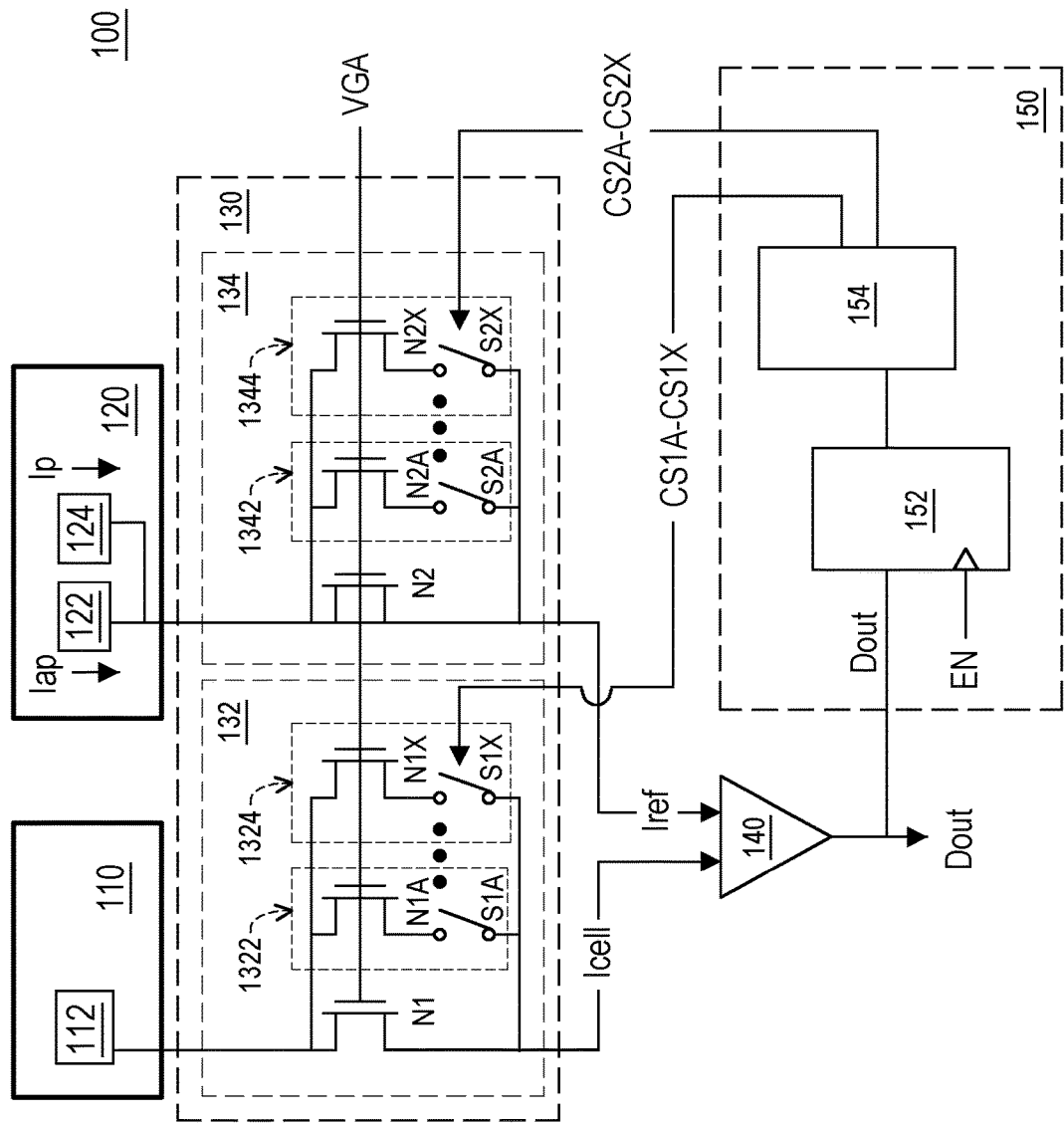
FIG. 1 is a diagram illustrating an exemplary memory device, in accordance with some embodiments of the present disclosure.

The following disclosure provides many different exemplary embodiments, or examples, for implementing different features of the provided subject matter. Specific simplified examples of components and arrangements are described below to explain the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this document, the term "coupled" may also be termed as "electrically coupled", and the term "connected" may be termed as "electrically connected." "Coupled" and "connected" may also be used to indicate that two or more elements cooperate or interact with each other.

Various embodiments of the present disclosure will be described with respect to embodiments in a specific context, namely a magnetic random-access memory (MRAM). The concepts in the disclosure may also apply, however, to other memory devices or memory technologies. For MRAM memory, a cell current separation between the two logic states, i.e., logical-1 and logical-0, is expected to be of the order of a microampere (μA) or less. A sensing current is placed between a first read current value associated with the logic-1 state and a second read current value associated with the logic-0 state.

FIG. 1 is a diagram illustrating an exemplary memory device 100, in accordance with some embodiments of the present disclosure. In some embodiments, the memory device 100 may be a magnetic random-access memory (MRAM). For example, the memory device 100 includes a MRAM memory array 110 having MRAM memory cells 112, a reference array 120 having reference cells 122, 124, a sensing circuit 130 including clamping circuits 132, 134, a sense amplifier 140 configured to output an output data Dout according to a cell current Icell flowing, via the clamping circuit 132, from a selected memory cell 112 and a reference current Iref flowing, via the clamping circuit 134, from the reference array 120. The memory device 100 also includes a feedback circuit 150 coupled between the sense amplifier 140 and the sensing circuit 130, and configured to trim the reference current Iref or the cell current Icell flowing through the sensing circuit 130.

Any of the MRAM memory cells 112 in the memory array 110 may be switched between a low resistance state and a high resistance state, depending on whether the memory cell 112 is configured with a high or a low logical state of data. For example, one memory cell 112 can be written to a parallel MRAM state (P), representing logical one, or be written to an anti-parallel MRAM state (AP), representing logical zero. The cell current Icell is representative of the resistance of the corresponding memory cell 112 storing data with the high or low resistance state, and may be generated by applying a predetermined voltage to the memory cell 112. Due to process variations, individual MRAM cells 112 in the memory array 110 may have different high resistance values and different low resistance values. Such process variations may result in a small difference, or even an overlap in the resistance values for different logic states, which can lead to read errors.

As shown in FIG. 1, the reference array 120 may include one or more low logic state ("0") reference cells 122 written to the anti-parallel MRAM state (AP) and one or more high logic state ("1") reference cells 124 written to the parallel MRAM state (P). In some embodiments, half of the reference cells in the reference array 120 are written to the parallel MRAM state (P), and half of the reference cells written to the anti-parallel MRAM state (AP) to obtain an averaged reference current Iref of (Ip+Iap)/2, where Ip and Iap are mean current values of the P-state and AP-state, respectively. Similarly, the reference current Iref may be generated by applying the same predetermined voltage as applied to the memory cell 112 to the low logic state reference cell 122 and the high logic state reference cell 124 in the reference array 120.

Generally, the sense amplifier 140 is configured to determine the binary logic state of data stored in the memory cell 112 by comparing the cell current Icell from the memory cell 112 with the reference current Iref obtained from the reference array 120. Accordingly, the sense amplifier 140 can provide the output signal Dout at an output node of the sense amplifier 140 indicating a logic-low or logic-high state of the data stored in the selected MRAM memory cell 112.

In some embodiments, the sensing circuit 130 is coupled between the sense amplifier 140 and the memory array 110 or the reference array 120. As shown in FIG. 1, the sensing circuit 130 includes the clamping circuits 132 and 134. The clamping circuit 132 is electrically coupled between the sense amplifier 140 and the memory array 110 and configured to define a bit line (BL) read voltage during memory operations. Similarly, the clamping circuit 134 is electrically coupled between the sense amplifier 140 and the reference array 120 to define a reference bit line read voltage during the memory operations.

In some embodiments, a sensing ratio can be varied to compensate for the reference current Iref or the cell current Icell. For example, assuming target values for a first current (e.g., current Iap) associated with a first logic state and a second current (e.g., current Ip) associated with a second logic state are 10 µA and 30 µA, respectively, a target reference current level may be the average value between 10 µA and 30 µA (i.e., at 20 µA). Accordingly, a cell current Icell can be determined as being higher or lower than this target reference current level. The sensing ratio may ordinarily be 2:1, so that a weighting factor of 0.5 is applied to one input of sense amplifier 140 (e.g., the reference current Iref is the sum of the first current Iap and the second current Ip divided by 2, i.e., the averaged reference current).

However, by changing the sensing ratio, the reference current Iref can be adjusted according to a prediction result based on workload analysis, so as to provide a larger sensing margin for a high-probability logic state. In some embodiments, the amount of adjustment of the reference current Iref (e.g., an offset value) may be predefined according to the prediction result. Thus, a threshold point for reading the data stored in the memory cell can be tuned to enlarge and preserve the sensing margin for the high-probability logic state. Accordingly, read error rates can be reduced.

For example, if subsequent bits are more likely to be logical one according to the prediction result, the sensing circuit 130 may adjust the sensing ratio to lower the reference current Iref, e.g., by setting the sensing ratio at 5:2 instead of 2:1. On the other hand, if subsequent bits are more likely to be logical zero according to the prediction result, the sensing circuit 130 may adjust the sensing ratio to increase the reference current Iref, e.g., by setting the sensing ratio at 5:3 instead of 2:1, ensuring improved sense functionality and the larger sensing margin. In some embodiments, the sensing ratio may be adjusted globally for all sense amplifiers 140 in the memory device 100, or on a per-I/O-device basis (e.g., for sense amplifier(s) 140 associated with particular I/O devices).

In some embodiments, MRAM memory cells 112 and logic state reference cells 122, 124 may be magnetic tunnel junction (MTJ) cells. The MTJ cell includes a fixed magnetic layer, a thin dielectric tunnel barrier and a free magnetic layer. When the magnetic moment of the free layer is parallel to the fixed layer, the MTJ cell has a low resistance. When the free layer magnetic moment is oriented anti-parallel to the fixed layer moment, the MTJ cell has a high resistance. The architecture of MTJ cells allows the magnetization of the free magnetic layer to be switched using spin-torque transfer (STT).

In some embodiments, the magnetic moment of the free magnetic layer is assumed initially antiparallel to the fixed magnetic layer. A current can be supplied from the free magnetic layer toward the fixed magnetic layer to switch the magnetization of the free magnetic layer to be parallel to the magnetization of the fixed magnetic layer. When current is driven from the free magnetic layer to the fixed magnetic layer, conduction electrons travel from the fixed magnetic layer to the free magnetic layer. A majority of conduction electrons traveling from the fixed magnetic layer have spins polarized in the same direction as the magnetic moments of the fixed magnetic layer. These electrons interact with the magnetic moments of the free magnetic layer close to the interface between the free magnetic layer and the thin dielectric tunnel barrier. Due to the interaction, the electrons transfer their spin angular momentum, which is anti-parallel to the magnetization of the free magnetic layer. When sufficient angular momentum is transferred, the magnetization of the free magnetic layer is switched to be parallel to the magnetization of the fixed magnetic layer. Accordingly, the memory cell 112 is written to the parallel MRAM state (P).

Alternatively, the current can be supplied from the opposite direction, from the fixed magnetic layer to the free magnetic layer, to switch the magnetization of the free magnetic layer to be antiparallel to the magnetization of the fixed magnetic layer. When the current is driven from the fixed magnetic layer to the free magnetic layer, the conduction electrons travel in the opposite direction, in which the majority of conduction electrons have spins polarized in the direction of the magnetization of the free magnetic layer (e.g., the same direction as the fixed magnetic layer). The majority of conduction electrons are transmitted through the fixed magnetic layer. However, a minority of conduction electrons have spins polarized antiparallel to the magnetization of the free magnetic layer and the fixed magnetic layer. These electrons are scattered back from the fixed magnetic layer and interact with the magnetic moments of the free magnetic layer when travelling back to the free magnetic layer. When sufficient angular momentum is transferred to the free magnetic layer, the magnetization of the free magnetic layer is switched to be antiparallel to the magnetization of the fixed magnetic layer. Accordingly, the memory cell 112 is written to the anti-parallel MRAM state (AP). It will be appreciated that the above description of the spin-torque transfer is exemplary and not meant to limit the scope of the present disclosure.

The thin dielectric tunnel barrier between the two magnetic layers is thin enough to allow the tunneling of electrons. In some embodiments, the thin dielectric tunnel barrier has a nonmagnetic composition and can be formed from any suitable material that may function as an electrical insulator. In some embodiments, the thin dielectric tunnel barrier includes alumina. In some other alternative embodiments, the thin dielectric tunnel barrier includes MgO. Examples of other dielectric materials that may be included in the thin dielectric tunnel barrier include oxides or nitrides of Al, Mg, Si, Hf, Sr, or Ti such as SiOx, SiNx, SiOxNy, AlOx, TOx, TiOx, AlNx, or any combinations thereof. The thin dielectric tunnel barrier can be formed by various processes such as, photolithography, chemical vapor deposition (CVD), plasma enhanced chemical vapor deposition (PECVD), physical vapor deposition (PVD), electrochemical deposition, molecular manipulation, oxidation, etching, chemical mechanical polishing, and/or other suitable processes. In some embodiments, the thin dielectric tunnel barrier may electrically insulate the fixed magnetic layer from the free magnetic layer independently, or in conjunction with other layers interposing the fixed magnetic layer and the free magnetic layer.

In some embodiments, the fixed magnetic layer and the free magnetic layer are ferromagnetic layers. The fixed magnetic layer and the free magnetic layer may include Co, Fe, Ni, Mn, B, and/or their alloys including, for example, NiFe, CoFe, CoFeB, or compounds thereof, including other ferromagnetic materials. The fixed magnetic layer and/or the free magnetic layer may be formed by various processes such as, photolithography, chemical vapor deposition (CVD), physical vapor deposition (PVD), electrochemical deposition, molecular manipulation, etching, chemical mechanical polish, and/or other processes.

As shown in FIG. 1, the clamping circuit 132 includes a clamp device N1 coupled between the memory array 110 and the sense amplifier 140 and multiple optional clamping branches 1322 and 1324 coupled to each other in parallel. Particularly, optional clamping branches 1322 and 1324 include clamp devices N1A-N1X, which can be turned on or off by corresponding control signals independently to adjust the cell current Icell for the sense amplifier 140 to achieve per-SA trimming and adjust the sensing ratio.

For example, the clamping branch 1322 includes the clamp device N1A (e.g., a transistor) and a switch device S1A coupled in series. Similarly, the clamping branch 1324 includes the clamp device N1X (e.g., a transistor) and a switch device S1X coupled in series. Accordingly, the respective states of the switch devices S1A, S1X determine whether optional clamp devices N1A and N1X are used. Various numbers of such clamp devices may be used to adjust the respective currents in various ways. For example, by closing the corresponding switch device to enable one of these clamp devices, the cell current Icell flowing through the clamping circuit 132 is increased. On the other hand, by opening the corresponding switch device to disable one of these clamp devices, the cell current Icell flowing through the clamping circuit 132 is reduced.

Similarly, the clamping circuit 134 includes a clamp device N2 coupled between the reference array 120 and the sense amplifier 140 and multiple optional clamping branches 1342 and 1344 coupled to each other in parallel. The clamping branches 1342 and 1344 include clamp devices N2A-N2X, which can also be turned on or off by corresponding control signals to achieve per-SA trimming and adjust the sensing ratio.

For example, the clamping branch 1342 includes the clamp device N2A (e.g., a transistor) and a switch device S2A coupled in series. Similarly, the clamping branch 1344 includes the clamp device N2X (e.g., a transistor) and a switch device S2X coupled in series. Accordingly, the respective states of the switch devices S2A, S2X determine whether optional clamp devices N2A and N2X are used. By closing the corresponding switch device to enable one of these clamp devices, the reference current Iref flowing through the clamping circuit 134 is increased. On the other hand, by opening the corresponding switch device to disable one of these clamp devices, the reference current Iref flowing through the clamping circuit 134 is reduced. In some embodiments, gates of the clamp devices N1A-N1X and N2A-N2X are coupled to each other and controlled by a gate bias VGA. In some embodiments, the gate bias VGA can be generated by on-chip analog circuits (not shown).

In some embodiments, the widths of the respective transistors may determine the magnitude of the current conducted between source and drain terminals of each transistor. Different numbers of optional clamping branches that are enabled or different widths for those transistors in the clamping branches may be used to provide various options for controlling the reference current Iref and the cell current Icell. Because the transistors in the clamping branches can be any size, any combination of numerator and denominator, and thus any sensing ratio, is achievable. In addition, it will be appreciated that the embodiments are not limited to two clamping branches in the clamping circuits 132 and 134. In various embodiments, any of the clamping circuits 132 and 134 may include any number of clamping branches.

Figure 2:
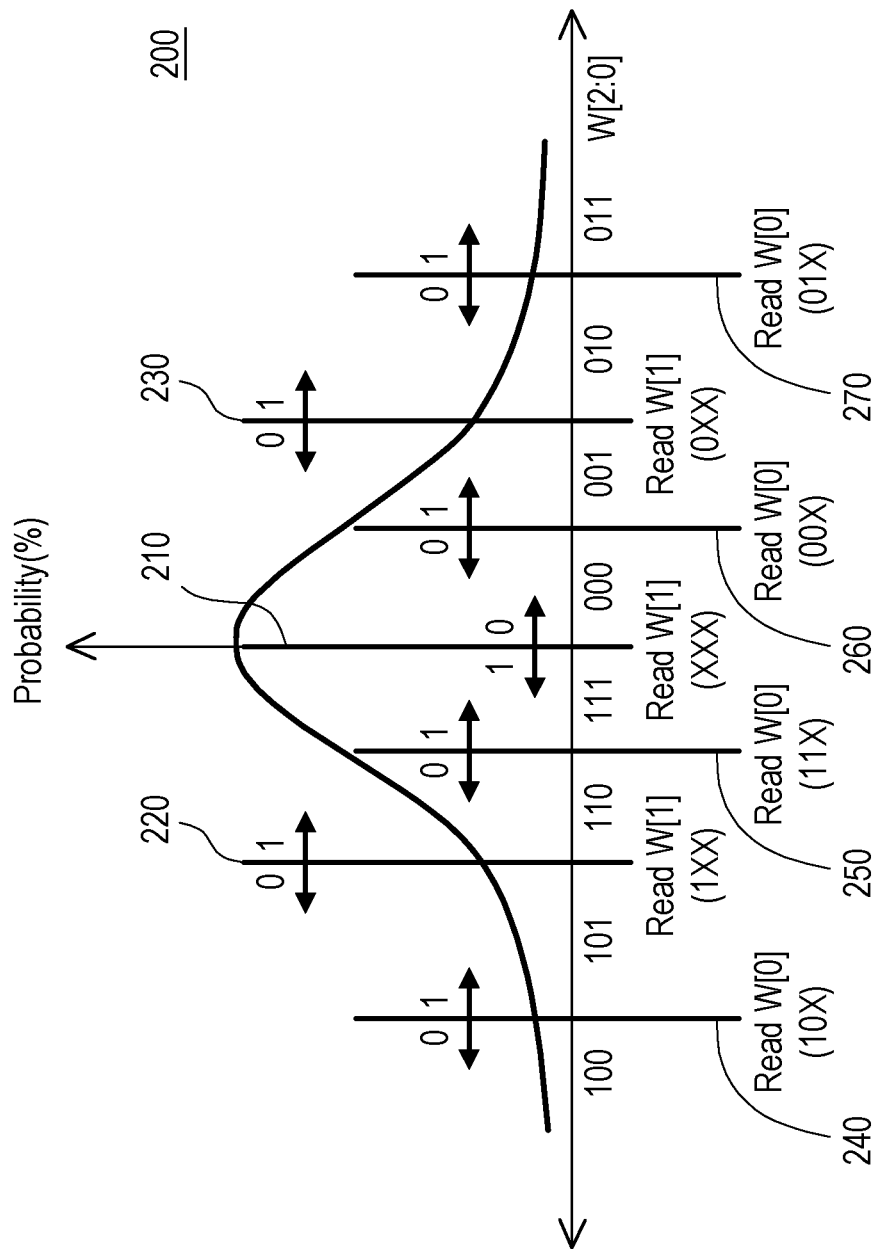
FIG. 2 is a diagram illustrating an exemplary distribution of data representing trained neural network weights, in accordance with some embodiments of the present disclosure.

FIG. 2 is a diagram illustrating an exemplary distribution 200 of data W[2:0] representing trained neural network weights, in accordance with some embodiments of the present disclosure. In some embodiments, the trained neural network weights stored in a memory often have a non-uniform distribution, such as a Gaussian distribution or a Gaussian-like distribution. For example, the distribution 200 shown in FIG. 2 may be a zero-centered Gaussian distribution representing 3-bit weight data W[2:0] in 2's complement representation. The 2's complement of a 3-bit number can be used to represent signed integers from −4 to 3. Particularly, the binary numbers representing the decimal values −4 to 3 in two's-complement form are 100, 101, 110, 111, 000, 001, 010, 011, in which a non-negative number is represented by the ordinary binary representation, and its two's complement, which can be calculated by inverting the bits and adding one, encodes the inverse negative number.

Under the scenario of a Gaussian or Gaussian-like distribution of the trained neural network weights, the 2's complement representation guarantees asymmetric data probability. For example, when reading the most significant (MSB) bit W[2] of the data, as indicated by line 210 in FIG. 2, the probability of the bit W[2] being 1 is substantially equal to the probability of the bit W[2] being 0. When reading the subsequent bit W[1] of the data, the probability of the bit W[1] being 1 and the probability of the bit W[1] being 0 are different according to the value of the bit [W2]. When the bit W[2] is 1, as indicated by line 220 in FIG. 2, the probability of the bit W[1] being 1 is greater than the probability of the bit W[1] being 0. When the bit W[2] is 0, as indicated by line 230 in FIG. 2, the probability of the bit W[1] being 1 is less than the probability of the bit W[1] being 0.

Similarly, when the bit W[2] is 1, as indicated by lines 240 and 250 in FIG. 2, the probability of the bit W[0] being 1 is greater than the probability of the bit W[0] being 0. When the bit W[2] is 0, as indicated by lines 260 and 270 in FIG. 2, the probability of the bit W[0] being 1 is less than the probability of the bit W[0] being 0. Accordingly, subsequent bits W[1] and W[0] may be predicted according to the most significant bit W[2].

Figure 3:
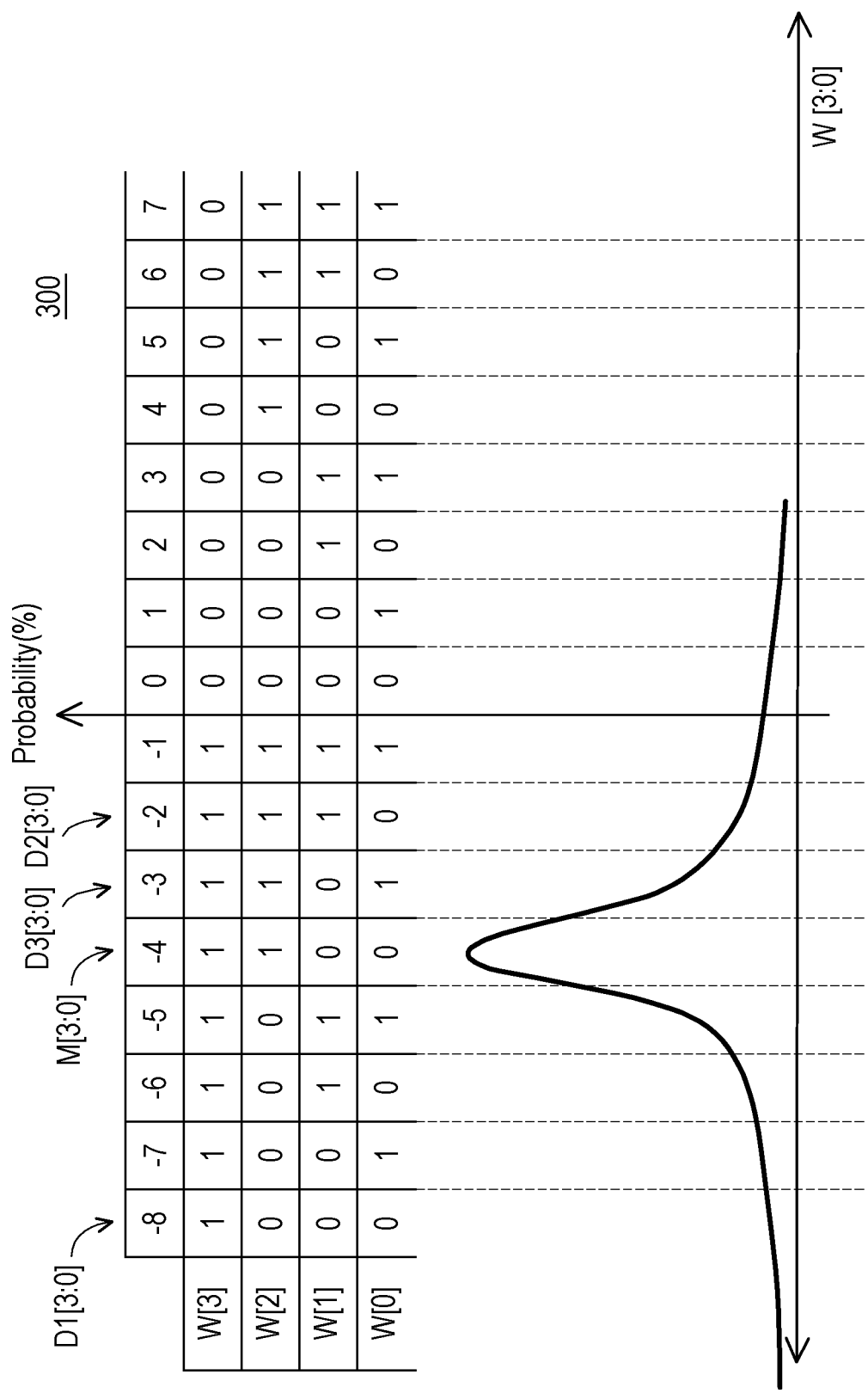
FIG. 3 is a diagram illustrating another exemplary distribution of data representing trained neural network weights, in accordance with some embodiments of the present disclosure.

FIG. 3 is a diagram illustrating another exemplary distribution 300 of data W[3:0] representing trained neural network weights, in accordance with some embodiments of the present disclosure. Compared to FIG. 2, the distribution 300 shown in FIG. 3 may be a non-zero-centered distribution representing a 4-bit weight distribution in 2's complement representation. For non-zero-centered distributions, a prediction value P[n] for a stored bit D[n] can be obtained, from the most significant bit (MSB) data to the least significant bit (LSB) data. In some embodiments, the prediction value P[n] can be determined according to a default prediction value M[n] corresponding to the distribution peak, and the accuracy of a prediction of a previous data bit P[n+1].

For example, with reference to the exemplary distribution 300 of FIG. 3, the distribution peak occurs at a value 1100, which is defined as the default prediction value M[3:0]. For the most significant bit, the default prediction value M[3] is used as the prediction value P[3]. For the subsequent bits of data, if the previous prediction is correct, the default prediction value M[n] is continued to be used as the prediction value P[n], until an incorrect prediction occurs. In other words, when the actual data value D[3] is equal to the prediction value P[3], the default prediction value M[2] is used as the prediction value P[2]. The above process can be performed repeatedly. When an incorrect prediction occurs for the bit D[n+1], the default prediction value M[n+1] is used as the prediction value P[n:0] for all subsequent bits.

In some embodiments, the default prediction value M[n:0] for each bit can be statistically determined after training the data. In addition, in some embodiments, the success rate of the data prediction may be relatively high when the data has a high distribution (e.g., tightly clustered data being closer to the middle value), while the success rate of the data prediction may be relatively low when the data has a low distribution (e.g., scattered data).

For example, if the default prediction value M[3:0] is 1100, the value with the highest probability based on the exemplary distribution 300 in FIG. 3, and the actual data D1[3:0] stored is 1000, which is the value with low probability, the prediction value P[3] for the MSB data is first obtained based on the default prediction value M[3] (i.e., 1). Because the prediction is correct (P[3]=1 and D1[3]=1), the prediction value P[2] for the following bit is also obtained based on the default prediction value M[2] (i.e., 1). However, the prediction is incorrect for the first time (P[2]=1 and D1[2]=0), so the default prediction value M[2] (i.e., 1) is assigned to prediction values P[1] and P[0] for the remaining bits. The above prediction is performed toward a higher probability, but both predictions of the actual data D1[1] and D1[0] are incorrect in this example.

In another example, if the actual data D2[3:0] stored is 1110, which is the value with medium probability based on the exemplary distribution 300 in FIG. 3, the prediction value P[3] for the MSB data is first obtained based on the default prediction value M[3] (i.e., 1). Because the prediction is correct (P[3]=1 and D2[3]=1), the prediction value P[2] for the following bit is also obtained based on the default prediction value M[2] (i.e., 1). Because the prediction is correct (P[2]=1 and D2[2]=1), the prediction value P[1] for the following bit is also obtained based on the default prediction value M[1] (i.e., 0). However, the prediction is incorrect for the first time (P[1]=0 and D2[2]=1), so the default prediction value M[1] (i.e., 0) is assigned to prediction values P[0].

In yet another example, if the actual data D3[3:0] stored is 1101, which is the value with high probability based on the exemplary distribution 300 in FIG. 3, the prediction value P[3] for the MSB data is first obtained based on the default prediction value M[3] (i.e., 1). Because the prediction is correct (P[3]=1 and D3[3]=1), the prediction value P[2] for the following bit is also obtained based on the default prediction value M[2] (i.e., 1). The prediction is also correct (P[2]=1 and D3[2]=1), and the prediction value P[1] for the following bit is again obtained based on the default prediction value M[1] (i.e., 0). The prediction is also correct (P[1]=0 and D3[1]=0), and the prediction value P[0] for the following bit is again obtained based on the default prediction value M[0] (i.e., 0).

As shown in the examples above, for the trained neural network weights stored in the memory, because the data distribution may be obtained by statistically evaluating the neural network model and the dataset used in the training, the memory device 100 may use the most significant bit value as an indicator for predicting subsequent bits accordingly based on the data probability.

Referring again to FIG. 1, when the memory device 100 predicts the following bit to be logical one, the feedback circuit 150 may output corresponding control signals CS1A-CS1X and CS2A-CS2X to the sensing circuit 130 to increase the reference current Iref or, alternatively, lower the cell current Icell to provide a larger sensing margin. On the other hand, when the memory device 100 predicts the following bit to be logical zero, the feedback circuit 150 may output corresponding control signals CS1A-CS1X and CS2A-CS2X to the sensing circuit 130 to lower the reference current Iref or, alternatively, increase the cell current Icell to provide larger sensing margin.

For example, the feedback circuit 150 may output the control signals CS1A-CS1X and CS2A-CS2X to selectively enable or disable one or more clamping branches 1322, 1324 or one or more clamping branches 1342,1344 in response to the output data Dout outputted by the sense amplifier 140, to adjust the cell current Icell or the reference current Iref. In the embodiments of FIG. 1, the feedback circuit 150 includes a latch circuit 152 and an adjusting circuit 154 electrically coupled to the latch circuit 152. The latch circuit 152 is configured to receive the output data Dout and an activation signal EN, which may be generated by a separate circuit (not shown) in the memory device 100. In some embodiments, the activation signal EN is triggered if the data to-be-read is a most significant bit (MSB). The activation signal EN can be provided from a memory controller. When the activation signal EN is enabled, the adjusting circuit 150 is activated and configured to output control signals CS1A-CS1X, CS2A-CS2X to the clamping circuits 132, 134, respectively according to the output data Dout. In some embodiments, the activation signal EN is enabled when the output data Dout is a most significant bit (MSB) data, in order to trigger the trimming of the reference current Iref or the cell current Icell. It is noted that in some other embodiments, the activation signal EN may also be enabled when the output data Dout is not a most significant bit (MSB) data. For example, the activation signal EN may also be enabled when the output data Dout is the MSB-n bit. Accordingly, in various embodiments, the memory device 100 can use the latter bits to predict the former bits, or use the former bits to predict the latter bits based on the workload analysis, including, but not limited to, the data distribution associated with the model and the dataset used in the neural network training, and adjust the cell current Icell or the reference current Iref according to the latched output data Dout in response to the activation signal EN, in order to favor a relatively high probability state for the subsequent bit.

In some embodiments, in response to the MSB output data Dout being logical one, the adjusting circuit 154 is configured to lower the reference current Iref flowing through the clamping circuit 134 by disabling one or more clamping branches 1342, 1344 using control signals CS2A-CS2X. In response to the MSB output data Dout being logical zero, the adjusting circuit 154 is configured to increase the reference current Iref flowing through the clamping circuit 134 by enabling one or more clamping branches 1342, 1344 using control signals CS2A-CS2X. In other words, the adjusting circuit 154 is configured to perform a reference-side adjustment to provide larger sensing margin, based on the logical value of the MSB output data Dout.

In some other embodiments, the adjusting circuit 154 may also be configured to perform a cell-side adjustment to provide a larger sensing margin, based on the logical value of the MSB output data Dout. When the adjusting circuit 154 perform the cell-side adjustment, in response to the MSB output data Dout being logical one, the adjusting circuit 154 is configured to increase the cell current Icell flowing through the clamping circuit 132 by enabling one or more clamping branches 1322, 1324 using control signals CS1A-CS1X. In response to the MSB output data Dout being logical zero, the adjusting circuit 154 is configured to lower the cell current Icell flowing through the clamping circuit 132 by disabling one or more clamping branches 1322, 1324 using control signals CS1A-CS1X.

In some other embodiments, the adjusting circuit 154 may also be configured to perform both the cell-side adjustment and the reference-side adjustment by enabling m clamping branches in the clamping circuit 132 and n clamping branches in the clamping circuit 134 by the control signals CS1A-CS1X, CS2A-CS2X, where m and n are integers. In response to the output data Dout being logical one, the adjusting circuit 154 outputs the control signals CS1A-CS1X, CS2A-CS2X to cause m to be greater than n, to relatively increase the cell current Icell with respect to the reference current Iref. For example, the adjusting circuit 154 may enable two clamping branches 1322 and 1324 in the clamping circuit 132 and only one clamping branch 1342 in the clamping circuit 134.

In response to the output data Dout being logical zero, the adjusting circuit 154 outputs the control signals CS1A-CS1X, CS2A-CS2X to cause m to be smaller than n, to relatively lower the cell current Icell with respect to the reference current Iref. For example, the adjusting circuit 154 may enable only one clamping branch 1322 in the clamping circuit 132, and two clamping branches 1342 and 1344 in the clamping circuit 134.

As shown in FIG. 1, any of the clamping branches 1322, 1324 in the clamping circuit 132 or the clamping branches 1342, 1344 in the clamping circuit 134 may include the corresponding clamp device (e.g., clamp devices N1A-N1X, N2A-N2X) and the corresponding switch device (e.g., switch devices S1A-S1X, S2A-S2X) electrically coupled in series. The clamp device N1A-N1X, N2A-N2X are controlled by the gate bias VGA, and the switch devices S1A-S1X, S2A-S2X are controlled by the feedback circuit 150. The feedback circuit 150 may separately turn on or turn off the switch device S1A-S1X, S2A-S2X by corresponding control signals CS1A-CS1X, CS2A-CS2X, in order to enable or disable the current clamping branches 1322, 1324, 1342, 1344 associated with the corresponding switch devices S1A-S1X, S2A-S2X.

Figure 4:
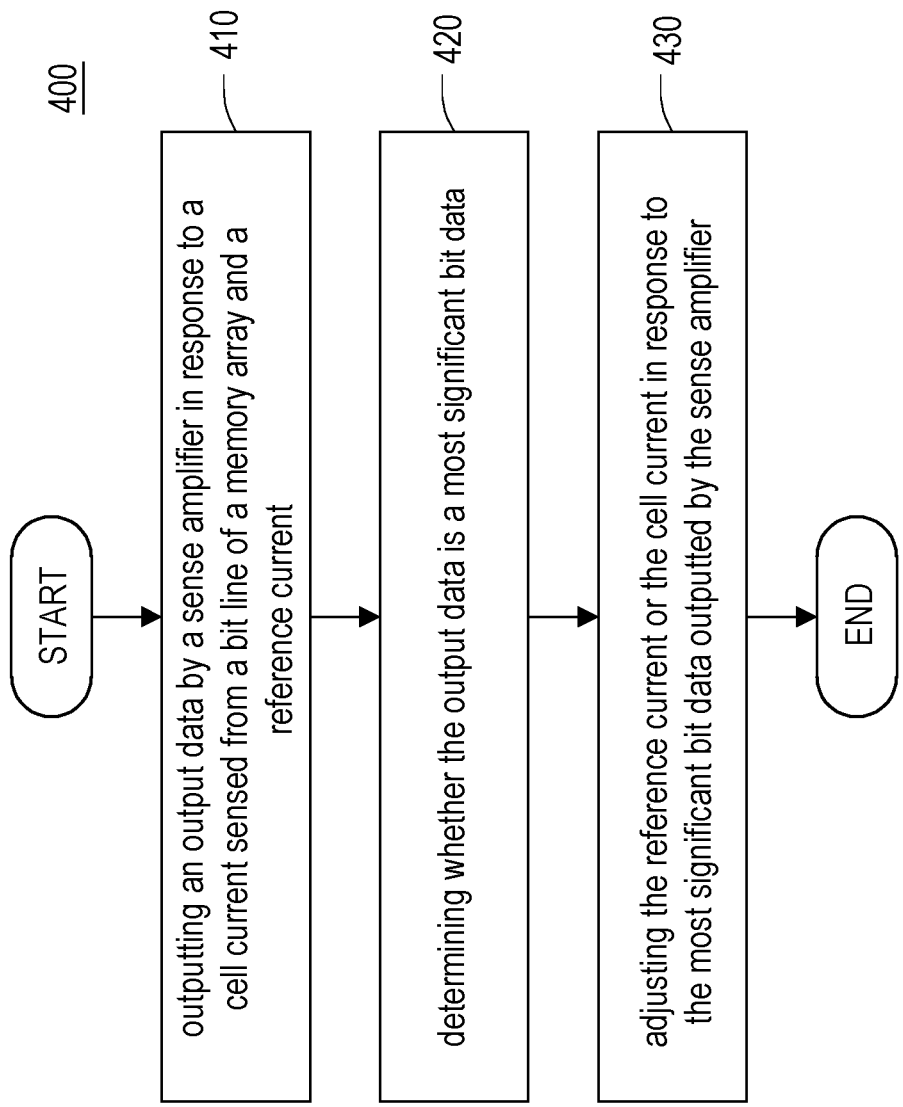
FIG. 4 is an exemplary flowchart of a method of adjusting a sensing current for a memory device, in accordance with some embodiments of the present disclosure.

FIG. 4 is an exemplary flowchart of a method 400 of adjusting a sensing current for a memory device, in accordance with some embodiments of the present disclosure. It is understood that additional operations may be performed before, during, and/or after the method 400 depicted in FIG. 4, and that some other operations may only be briefly described herein. The method 400 can be performed for the memory device 100 illustrated in the embodiments of FIGS. 1-3, but the present disclosure is not limited thereto.

In operation 410, a sense amplifier (e.g., sense amplifier 140 in FIG. 1) outputs an output data Dout in response to a cell current (e.g., cell current (cell in FIG. 1) sensed from a bit line of a memory array (e.g., memory array 110 in FIG. 1) and a reference current (e.g., reference current Iref in FIG. 1).

In operation 420, a feedback circuit (e.g., feedback circuit 150 in FIG. 1) determines whether the output data is a most significant bit (MSB) data. For example, a latch circuit in the feedback circuit may receive an activation signal (e.g., latch circuit 152 receives activation signal EN in FIG. 1). In some embodiments, in operation 420, the activation signal to the latch circuit is enabled in response to the output data being the MSB data.

In operation 430, the feedback circuit adjusts the reference current or the cell current in response to the most significant bit data outputted by the sense amplifier. In some embodiments, the latch circuit 152 in the feedback circuit 150 receives the output data Dout. When the activation signal is enabled, an adjusting circuit (e.g., adjusting circuit 154 in FIG. 1) in the feedback circuit selectively enables or disables one or more first clamping branches (e.g., clamping branches 1322 and 1324 in FIG. 1) in a first clamping circuit (e.g., clamping circuit 132 in FIG. 1) associated with the cell current, or one or more second clamping branches (e.g., clamping branches 1342 and 1344 in FIG. 1) in a second clamping circuit (e.g., clamping circuit 134 in FIG. 1) associated with the reference current, in response to the output data.

In some embodiments, the step of adjusting the reference current or the cell current in operation 430 includes a reference current adjustment to lower the reference current in response to the output data being logical one, and increase the reference current in response to the output data being logical zero. In some other embodiments, the step of adjusting the reference current or the cell current in operation 430 includes a cell current adjustment to lower the cell current in response to the output data being logical zero and increase the cell current in response to the output data being logical one.

In some embodiments, in operation 430, the adjusting circuit is configured to enable m first clamping branches and n second clamping branches, where m and n are integers. In response to the output data being logical one, m is greater than n. In response to the output data being logical zero, m is smaller than n. In other words, when the MSB output data is logical one, the number of enabled clamping branches associated with the cell current is greater than the number of enabled clamping branches associated with the reference current. When the MSB output data is logical zero, the number of enabled clamping branches associated with the cell current is less than the number of enabled clamping branches associated with the reference current.

By the operations described above, a method for adjusting a sensing current for a memory device can be performed accordingly to perform a reference-side current adjustment and/or a cell-side current adjustment to provide a larger sensing margin based on a data prediction according to the MSB data. Accordingly, read errors can be reduced, and the accuracy and the efficiency of the memory device can be improved.

It will be appreciated that while the circuit architectures and methods described above are illustrated in connection with MRAM cells, such as STT-MRAM cells, the approach described herein can be applied to reading other types of memory cells where process variations may lead to small differences in the distribution of logical high and logical low cell characteristics, meaning a fixed reference current may not be an ideal sense threshold to provide accurate results. Likewise, it should be appreciated that the present disclosure is not limited in use to STT-M RAM but also may be used in other types of MRAM.

In some embodiments, a circuit is disclosed that includes a sense amplifier, a first clamping circuit, a second clamping circuit, and a feedback circuit. The first clamping circuit includes first clamping branches coupled in parallel between the sense amplifier and a memory array. The second clamping circuit includes second clamping branches coupled in parallel between the sense amplifier and a reference array. The feedback circuit is configured to selectively enable or disable one or more first clamping branches or one or more second clamping branches in response to output data outputted by the sense amplifier.

In some embodiments, a method of adjusting a sensing current for a memory device is disclosed. The method includes: outputting output data by a sense amplifier in response to a cell current sensed from a bit line of a memory array and a reference current; determining whether the output data is a most significant bit data; and adjusting the reference current or the cell current in response to the most significant bit data outputted by the sense amplifier.

In some embodiments, a memory device is disclosed that includes a memory array, a reference array, a first clamping circuit coupled to the memory array, a second clamping circuit coupled to the reference array, a sense amplifier configured to output data in response to a cell current flowing through the first clamping circuit and a reference current flowing through the second clamping circuit, and a feedback circuit configured to adjust the cell current or the reference current in response to the output data.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
    a sense amplifier;
    a first clamping circuit including a plurality of first clamping branches coupled in parallel between the sense amplifier and a memory array;
    a second clamping circuit including a plurality of second clamping branches coupled in parallel between the sense amplifier and a reference array; and
    a feedback circuit configured to selectively enable or disable one or more of the first clamping branches or one or more of the second clamping branches in response to output data outputted by the sense amplifier.

2. The circuit of claim 1, wherein the feedback circuit comprises:
    a latch circuit configured to receive the output data and an activation signal; and
    an adjusting circuit configured to output control signals to the first clamping circuit and the second clamping circuit according to the output data when the activation signal is enabled.

3. The circuit of claim 2, wherein the activation signal is enabled when the output data is a most significant bit (MSB) data.

4. The circuit of claim 2, wherein the adjusting circuit is configured to lower a reference current flowing through the second clamping circuit by disabling one or more of the second clamping branches in response to the output data being logical one.

5. The circuit of claim 2, wherein the adjusting circuit is configured to increase a reference current flowing through the second clamping circuit by enabling one or more of the second clamping branches in response to the output data being logical zero.

6. The circuit of claim 2, wherein the adjusting circuit is configured to increase a cell current flowing through the first clamping circuit by enabling one or more of the first clamping branches in response to the output data being logical one.

7. The circuit of claim 2, wherein the adjusting circuit is configured to lower a cell current flowing through the first clamping circuit by disabling one or more of the first clamping branches in response to the output data being logical zero.

8. The circuit of claim 2, wherein the adjusting circuit is configured to enable m first clamping branches and n second clamping branches by the plurality of control signals,
    wherein m is greater than n in response to the output data being logical one, and m is smaller than n in response to the output data being logical zero, m and n being integers.

9. The circuit of claim 1, wherein the feedback circuit is configured to adjust a reference current flowing through the second clamping circuit in response to the output data when the output data is a MSB data.

10. The circuit of claim 1, wherein the feedback circuit is configured to adjust a cell current flowing through the first clamping circuit in response to the output data when the output data is a MSB data.

11. The circuit of claim 1, wherein one of the plurality of first clamping branches or the plurality of second clamping branches comprises:
    a clamp device controlled by a gate bias; and a switching device coupled to the clamp device in series and controlled by the feedback circuit.

12. A method of adjusting a sensing current for a memory device, comprising:
outputting output data by a sense amplifier in response to a cell current sensed from a bit line of a memory array and a reference current;
determining whether the output data is a most significant bit data; and
adjusting the reference current or the cell current in response to the most significant bit data outputted by the sense amplifier.

13. The method of claim 12, further comprising:
enabling an activation signal to a latch circuit, in response to the output data being the most significant bit data;
receiving, by the latch circuit, the output data; and
when the activation signal is enabled, in response to the output data, selectively enabling or disabling one or more first clamping branches in a first clamping circuit associated with the cell current, or one or more second clamping branches in a second clamping circuit associated with the reference current.

14. The method of claim 13, further comprising:
enabling m first clamping branches and n second clamping branches, wherein m is greater than n in response to the output data being logical one, and m is smaller than n in response to the output data being logical zero, m and n being integers.

15. The method of claim 12, wherein adjusting the reference current or the cell current comprises:
lowering the reference current in response to the output data being logical one; and
increasing the reference current in response to the output data being logical zero.

16. The method of claim 12, wherein adjusting the reference current or the cell current comprises:
lowering the cell current in response to the output data being logical zero; and
increasing the cell current in response to the output data being logical one.

17. A memory device, comprising:
a memory array and a reference array;
a first clamping circuit coupled to the memory array;
a second clamping circuit coupled to the reference array;
a sense amplifier configured to output data in response to a cell current flowing through the first clamping circuit and a reference current flowing through the second clamping circuit; and
a feedback circuit configured to adjust the cell current or the reference current in response to the output data.

18. The memory device of 17, wherein the feedback circuit comprises:
a latch circuit configured to receive the output data and an activation signal, the activation signal being enabled when the output data is a most significant bit (MSB) data; and
an adjusting circuit configured to output a plurality of control signals to selectively enable or disable one or more clamping branches in the first clamping circuit or in the second clamping circuit according to the output data when the activation signal is enabled.

19. The memory device of 18, wherein the adjusting circuit is configured to increase the reference current or lower the cell current in response to the output data being logical zero.

20. The memory device of 18, wherein the adjusting circuit is configured to increase the cell current or lower the reference current in response to the output data being logical one.

* * * * *

UNITED STATES PATENT AND TRADEMARK OFFICE
CERTIFICATE OF CORRECTION

PATENT NO. : 11,915,733 B2
APPLICATION NO. : 17/577040
DATED : February 27, 2024
INVENTOR(S) : Win-San Khwa et al.

It is certified that error appears in the above-identified patent and that said Letters Patent is hereby corrected as shown below:

In the Claims

In Claim 18, Column 14, Line 16, "device of 17," should read --device of claim 17,--.

In Claim 19, Column 14, Line 27, "device of 18," should read --device of claim 18,--.

In Claim 20, Column 14, Line 31, "device of 18," should read --device of claim 18,--.

Signed and Sealed this
Fourteenth Day of May, 2024

Katherine Kelly Vidal
*Director of the United States Patent and Trademark Office*